United States Patent [19]

Coburn

[11] Patent Number: 5,451,865
[45] Date of Patent: Sep. 19, 1995

[54] METHOD AND APPARATUS FOR SENSING AN INPUT CURRENT WITH A BRIDGE CIRCUIT

[75] Inventor: David C. Coburn, Somersworth, N.H.

[73] Assignee: General Electric Company, Schenectady, N.Y.

[21] Appl. No.: 202,334

[22] Filed: Feb. 25, 1994

[51] Int. Cl.6 .................................................. G01R 1/20
[52] U.S. Cl. .............................. 324/127; 324/123 R; 324/117 R; 324/142; 324/105
[58] Field of Search ............... 324/127, 123 R, 117 R, 324/142, 105

[56] References Cited

U.S. PATENT DOCUMENTS

| | | |
|---|---|---|
| 2,831,164 | 4/1958 | Johnson . |
| 2,915,707 | 5/1959 | Bradstock ........................... 324/127 |
| 3,372,334 | 3/1968 | Fenoglio et al. . |
| 3,665,357 | 5/1972 | Tsubouchi et al. . |
| 4,140,961 | 2/1979 | Akamatsu . |
| 4,182,982 | 1/1980 | Wolf et al. . |
| 4,240,059 | 12/1980 | Wolf et al. . |
| 4,492,919 | 1/1985 | Milkovic . |
| 4,494,068 | 1/1985 | Ley et al. . |
| 4,513,274 | 4/1985 | Halder . |
| 4,580,095 | 4/1986 | De Vries . |
| 4,626,778 | 12/1986 | Friedl . |
| 4,684,827 | 8/1987 | Ohms . |
| 4,794,326 | 12/1988 | Friedl . |
| 4,810,989 | 3/1989 | Brandenberg et al. . |
| 4,835,463 | 5/1989 | Baran et al. . |
| 4,894,610 | 1/1990 | Friedl . |
| 4,939,451 | 7/1990 | Baran ................................... 324/127 |
| 5,027,059 | 6/1991 | de Montgolfier et al. . |
| 5,066,904 | 11/1991 | Bullock .............................. 324/127 |

OTHER PUBLICATIONS

GE Meter & Control; "GE Type EV TM and Phase3 TM Meters"; Donald F. Bullock and David D. Elmore; Mar. 1991; 4 pages.

*Primary Examiner*—Kenneth A. Wieder
*Assistant Examiner*—Mark Wardas
*Attorney, Agent, or Firm*—Bell, Seltzer, Park & Gibson

[57] ABSTRACT

A current sensor includes first and second branches interconnected by a center conductor magnetically coupled to an annular current comparator for producing an output signal related, in magnitude and phase, to an input current. The input current divides, according to a predetermined relationship, between the first and second branches such that the current in the center conductor interconnecting the first and second branches is also related to the input current. A current is induced in the annular current comparator in relation to the current in the center conductor and, thus, in relation to the input current. Secondary windings are wound about and magnetically coupled to the annular current comparator for producing an output signal responsive to the current induced within the annular current comparator.

22 Claims, 2 Drawing Sheets

METHOD AND APPARATUS FOR SENSING AN INPUT CURRENT WITH A BRIDGE CIRCUIT

FIELD OF THE INVENTION

The present invention relates to sensors for sensing a current and, more particularly, to current sensors for producing an output signal related to the sensed input current.

BACKGROUND OF THE INVENTION

Many electrical devices, such as electronic electricity meters and induction or electronic type watthour meters for measuring electric power and energy usage, require current sensors for sensing the line current and producing an output signal related to the line current. These devices demand sensors which are accurate for a wide range of line currents.

For many years, induction type watthour meters have been used to measure energy consumption by individual electrical energy users, with consumption measured in kilowatt hours. Induction type watthour meters typically have separate voltage and current coils with a rotating disk driven by a combination of fluxes from the coils. Conventional induction watthour meters include a current sensing circuit in which the conductor carrying the line current is wrapped about in an iron core to form a current coil. A magnetic flux is created in the iron core due to the current in the conductor. The magnetic flux in the iron core, in combination with the magnetic flux from a similar voltage coil, rotates a disk at a rate related to the customer's electrical energy consumption rate.

Current transformers are used in conjunction with the above-described current sensing circuits to scale down relatively large line currents, i.e., greater than about 320 amperes ("A"), since the number of turns about the iron core required to properly scale such relatively large line currents would become prohibitively large. The current transformer is disposed between the line conductor and the current sensing circuit. While such current transformers are generally rated to have a nominal current in their secondary winding of 5 A, approximately 20 A of secondary current may usually be drawn without exceeding the thermal rating of the transformer. Thus, even with the introduction of a current transformer between the conductor and the current sensing circuit, induction type watthour meters must still be capable of measuring relatively large currents, such as 20 A.

Such relativity large currents, however, cannot be accurately sensed by electronic electricity meters, such as electronic watthour meters or other electronic metering devices which typically utilize electronic or integrated circuits for measuring the current and voltage usage of individual electrical energy customers. The integrated circuits are generally application specific integrated circuit ("BASIC") which are designed to accept and measure small signal levels, such as typically less than 2 mA and less than 5 volts. The current sensors in electronic watthour meters, therefore, must have a large line transformation ratio to scale the relatively large line currents to the relatively small input levels accepted by the sensor's integrated circuits.

In order to produce such relatively small output signals, typical current transformers would become prohibitively large and expensive. This increased size and expense is due, in part, to the requirement that the ampere turns of the primary and secondary windings must be equal for proper operation. The number of windings must also be selected such that the maximum input line current is scaled to a value less than the 2 mA current limit for the integrated circuit. Since line currents typically vary from 0.5 A to 320 A, the transformation ratio of typical current transformers would need to be approximately 160,000:1 to convert 320 A of line current to a scale output current of 2 mA. A transformation ratio of 160,000:1, however, would require a relatively large number of windings and a prohibitively large and expensive current transformer.

In addition to being prohibitively large and expensive, the magnetic cores of typical current transformers saturate if the alternating current ("AC") flowing in a line conductor is superimposed upon a direct current ("DC"). The direct current, and thus the saturation of the magnetic core, is generally due to half-wave rectification of AC signals by various electrical devices connected to the line conductor or by persons intentionally superimposing DC components upon the line conductor to commit meter fraud by preventing proper current sensing and electrical energy consumption measurement.

Furthermore, typical current transformers produce an external magnetic field which may affect adjacent electrical devices, such as other current transformers in a polyphase watthour meter. The current transformation in typical current transformers may also be adversely affected by incident magnetic fields from external sources such as adjacent current sensors employed in polyphase watthour meters.

An alternative current sensor to such typical current transformers is provided in U.S. Pat. No. 4,182,982 to Wolf et al. which issued January 1980 and U.S. Pat. No. 4,492,919 to Milkovic which issued January 1985 (hereinafter the '982 and '919 patents, respectively). The '982 and '919 patents disclose the division of a line conductor into one or more main shunt paths and a parallel auxiliary shunt path having different cross-sectional areas. The current divides between these two shunt paths substantially in proportion to the cross-sectional areas of the two paths. The auxiliary shunt path passes through the bore of a toroidal magnetic core. A current transformer is formed by the combination of the toroidal magnetic coil, the auxiliary shunt path which forms a one turn primary winding, and a winding of many turns wound about the toroidal magnetic core which forms a secondary winding.

The cross-sectional areas of the primary shunt path and the auxiliary shunt path, however, may become prohibitively large and small, respectively, in order to properly scale the line current over the large range of potential line currents. Furthermore, the parallel primary and auxiliary shunt paths are affected not only by magnetic fields produced by external sources, but also by magnetic fields produced by the current in the other shunt paths. For example, the current in the primary shunt path is affected by the magnetic field produced by the current in the auxiliary shunt path. In addition, the magnetic coupling between the parallel conductors in the current divider produces a mutual inductance between the two parallel conductors. This inductance transforms the relatively simple resistance divider to a complex impedance divider with the phase shift of the current in the main shunt path and parallel auxiliary path dependant on the inductance. Since adequate metering accuracy demands that both the magnitude and the phase angle of the scaled output signal of the current sensor accurately reflect the magnitude and the phase angle of the line current, such phase shifts in the parallel shunt paths, which, in turn, are reflected in the output signal of the current sensor impair metering accuracy.

A coaxial current sensor is disclosed in U.S. Pat. No. 5,066,904 to Bullock which issued on Nov. 19, 1991 and is assigned to the assignee of the present invention, the disclosure of which is incorporated herein by reference. The coaxial current sensor divides the current in the line conductor between two coaxially-arranged conductors. The center coaxial conductor is directed through the bore of a magnetic toroidal core and induces magnetomotive force in the toroidal core.

Sense and feedback secondary windings are also wound about the toroidal core. A voltage is induced in the sense winding due to and in proportion to the time-rate of change of the magnetomotive force in the toroidal core. An amplifier responsive to the voltage induced in the sense secondary winding provides a control or compensation signal to the feedback secondary winding. The current in the feedback winding due to the control signal produces a magnetomotive force in the toroidal core, substantially equal in magnitude and opposite in polarity to the magnetomotive force induced by the current in the center coaxial conductor. The resultant net AC magnetomotive force in the magnetic toroidal core is approximately zero in a steady-state condition. Thus, the likelihood of saturation of the core is significantly diminished. Further, any current in the magnetic toroidal core is primarily due to changes in the input current is induced in relation to the current in the center coaxial conductor. The feedback second secondary winding also produces the output current which is proportional to the current in the center coaxial conductor.

A differential current sensor is disclosed in U.S. patent application Ser. No. 08/043,903 filed Apr. 7, 1993 and assigned to the assignee of the present invention, the disclosure of which is incorporated herein by reference. The differential current sensor divides an input line current into first and second portions having a predetermined ratio therebetween. The difference in current between the first and second portions is thereafter sensed, such as by a toroidal winding which is magnetically coupled to the first and second portions of the input current. Based upon the sensed current differential between the first and second portions, an output current is produced related to the current differential and, thus, related to the input current.

In particular, the input current divides into first and second portions and is conducted by first and second conductors, respectively, which extend through a bore of the toroidal winding. The first portion of the input current flows in a first direction through the bore of the toroidal winding while the second portion of the input current is in a second direction, opposite the first direction, through the bore of the toroidal winding. Thus, the current differential between the first and second portions induces a voltage in the toroidal winding. The differential current sensor preferably includes means for magnetically sensing the voltage induced in the toroidal winding and producing an output current in response thereto. The means for magnetically sensing the current differential is typically sense and feedback secondary windings wound about the toroidal magnetic core as described above.

While the coaxial and differential current sensors represent great advances in the art of sensing and scaling line currents, particularly for use in electricity meters, such as electronic watthour meters, further improvements are desirable. In particular, the coaxial conductors of the coaxial current sensor magnetically couple due to the magnetic field produced by the current in each conductor and the resulting self-inductance in the other conductor. This mutual inductance introduces a phase shift or error in the resulting scaled output current.

In addition, since the ratio at which the current divides between the coaxial conductors depends upon the cross-sectional areas of the conductors, the ratio of current division may be adjusted by trimming the resistances of the conductors, such as by drilling a portion of the material from a first end of the conductors. This removal or drilling of the conductors may be difficult due to the alignment and size of the conductors. Furthermore, both the coaxial and the differential current sensors are of relatively complex design and, accordingly, may be expensive to fabricate.

Still further, the bore of the toroidal core of the differential current sensor is substantially perpendicular to the first and second portions of current conducted by the current sensor outside of the bore. Accordingly, the magnetic flux induced by the current conducted by the current sensor outside of the bore of the toroidal core magnetically couples to the sense and feedback secondary windings so as to introduce a phase shift in the scaled output current. Furthermore, both the coaxial and the differential current sensors are of relatively complex design and, accordingly, may be expensive to fabricate.

Thus, while it would be desirable to have a current sensor for producing an output current having a magnitude and phase angle related to an input current, particularly for use in sensing line currents in electricity meters, such as electronic watthour meters, current sensors still suffer from a number of deficiencies, including complex and costly designs and undesirable magnetic coupling which results in phase shifts in the output signal. In particular, it would be desirable to have a current sensor having a relatively simple design which produces an output signal having a magnitude of approximately 2-3 mA which is related to the magnitude and phase of the input current for use with electricity meters which utilize electronic or integrated circuits for measuring a customer's electrical energy consumption.

SUMMARY OF THE INVENTION

It is therefore an object of the invention to provide an improved method and apparatus for sensing an input current.

It is another object of the invention to provide an improved method and apparatus for sensing an input current signal and producing a related output current signal.

It is a further object of the invention to provide an improved method and apparatus for sensing an input current signal and producing an output current signal related in magnitude and phase to the input current signal.

These and other objects are provided, according to the invention, by a current sensor including first and second conducting means connected by an interconnecting conducting means to which a sensing means is magnetically coupled. The first conducting means conducts a first portion of the input current and preferably includes first and second conductors, typically first and second resistors, having first and second predetermined resistances, respectively. The second conducting means conducts a second portion of the input current and preferably includes third and fourth conductors, typically third and fourth resistors, having third and fourth predetermined resistances, respectively.

The interconnecting conducting means preferably includes a center or fifth conductor, typically a fifth resistor, having a fifth predetermined resistance and extending from a first end between the first and second conductors to a second end between the third and fourth conductors so as to form a bridge circuit. A current having a predetermined relation to the input current is established in the interconnecting conductor. In turn, the sensing means produces an output signal related to the current in the interconnecting conductor. This output current may be detected by an integrated circuit in an electronic electricity meter, such as an electronic watthour meter, to accurately measure a consumer's electrical energy consumption.

The sensing means is preferably an annular current comparator and, more preferably, includes a toroidal core having a bore extending therethrough. The interconnecting conductor extends through the bore of the toroidal core and, in combination, form a single turn primary winding for a current comparator. The current conducted by the interconnecting conductor induces a related magnetomotive force in the toroidal core. By sensing the current in the interconnecting conductor, and thus the input current, with induced magnetomotive force, the output signals is isolated from the input current so as to suppress voltage transients in the input current and to protect the current sensor.

The sensing means also preferably includes means for magnetically sensing the time-rate of change of the magnetomotive force induced within the toroidal core. The means for magnetically sensing the time-rate of change of the magnetomotive force induced within the toroidal core preferably includes a secondary winding wound about and magnetically coupled to the toroidal core for producing the output signal. The means for magnetically sensing the time-rate of change of the magnetomotive force in the toroidal core more preferably includes a feedback secondary winding and a sense secondary winding with each secondary winding wound about and magnetically coupled to the toroidal core with an amplifier circuit disposed therebetween. The combination of the feedback and sense secondary windings and the associated amplifier circuit produces the output signal which is related to and preferably proportional to the magnitude and phase of the input current signal. The secondary windings and the associated amplifier circuit also induce a magnetomotive force in the toroidal core equal in magnitude and opposite in polarity to the magnetomotive force induced by the current in the interconnecting conductor such that the net AC magnetomotive force in the core is approximately zero in steady-state and any changes in magnetomotive force in the toroidal core is due to changes in the current in the interconnecting conductors.

The ratio of the first and second predetermined resistances of the first and second conductors to the third and fourth predetermined resistances of the third and fourth conductors preferably remains constant as the temperature of the conductors varies. More particularly, the first and fourth conductors are preferably comprised of both a first material, such as Copel, a copper nickel alloy, or Manganin, a magnesium copper alloy, and a second material, such as copper. The second and third conductors are preferably comprised solely of the second material, such as copper. The resistivity of the first material preferably does not vary significantly with temperature. However, the resistivity of the second material, such as copper, does vary with temperature. Thus, the relative amounts of the first and second materials comprising the conductors is preferably selected such that the ratio of the first and second predetermined resistances to the third and fourth predetermined resistances does not vary with temperature.

In addition to the inherent properties of the materials from which the conductors formed, the resistances of the conductors depend generally upon their respective cross-sectional areas. Thus, the respective resistances may be readily trimmed or adjusted by notching the conductors or removing material from the conductors to obtain the appropriate ratio between the first and second predetermined resistances and the third and fourth predetermined resistances.

The first and third resistors preferably form a first generally U-shaped member having first and second arms, and are connected at their respective first ends to a first leg. The second and fourth resistors also preferably form a second generally U-shaped member having first and second arms, and are preferably connected at their respective first ends to the second ends of the first and third resistors, respectively, and at their second ends to a second leg. The interconnecting conductor is preferably a wire connected between the respective second ends of the first and third resistors and extends through the bore of a toroidal core. The longitudinal axis defined by the bore of the toroidal core is preferably parallel to the first and second generally U-shaped members so as to decrease the magnetic coupling between the current in the generally U-shaped members and the secondary windings wound about the toroidal core. The input current is preferably conducted by the first leg while the output current is preferably conducted by the second leg. In addition, the first and second legs are preferably designed to mate with and make electrical contact with conventional meter sockets.

The current sensing method and apparatus of this invention allows an input current signal to be sensed and an output current signal produced which is related to the magnitude and phase of the input current signal based upon the current in the interconnecting or center conductor of an unbalanced bridge circuit. The output current signal is related to the magnitude and phase of the input current signal since the current in the interconnecting or center conductor of the bridge circuit is directly proportional to the input current signal received by the bridge circuit. In addition, the current sensor of the present invention reduces errors in the phase of the output signal due to mutual inductance or coupling between the first and second conducting branches and the secondary windings about the toroidal core.

DESCRIPTION OF THE PREFERRED EMBODIMENT

The present invention now will be described more fully hereinafter with reference to the accompanying drawings, in which a preferred embodiment of the invention is shown. This invention may however be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
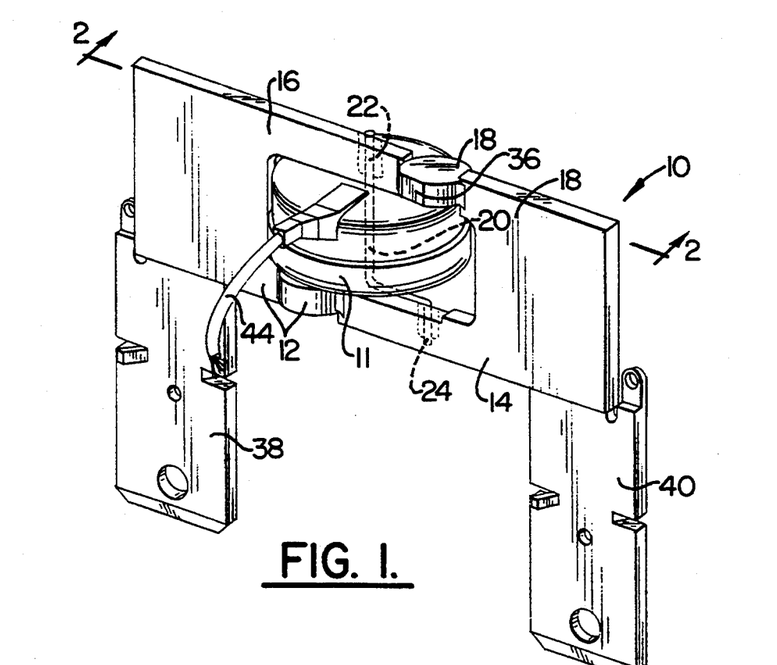
FIG. 1 is a perspective view of a current sensor according to the present invention.
Figure 3:
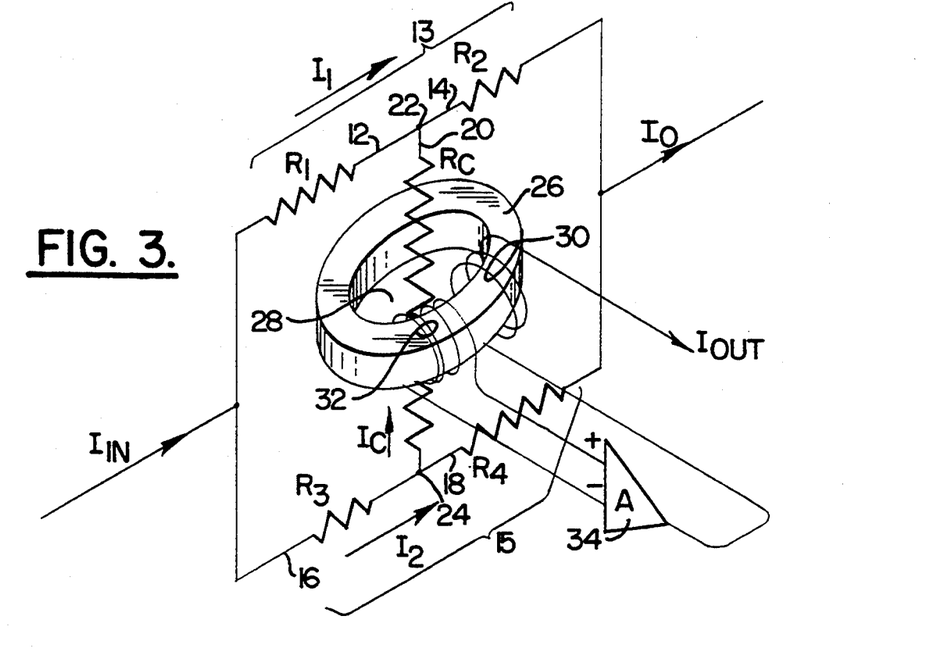
FIG. 3 is an electrical schematic of the current sensor of FIG. 1.
Figure 4:
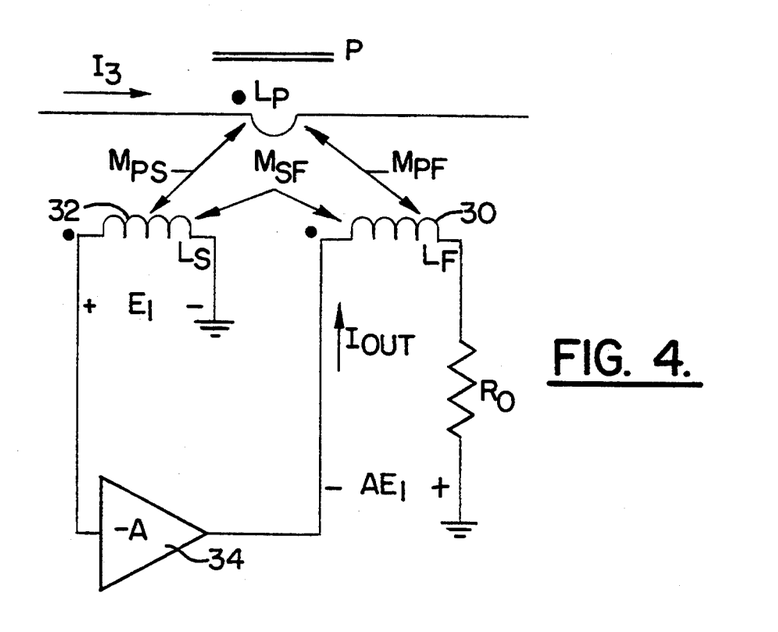
FIG. 4 is a schematic view of a current sensor according to the present invention including the toroidal winding and sense and feedback secondary windings.

Referring now to FIGS. 1 and 3, a current sensor 10 according to the present invention as illustrated. The current sensor 10 includes first and second conducting means 13 and 15, respectively, such as first and second branches, for conducting first and second portions of an input current $I_{IN}$, respectively, and an interconnecting conducting means, such as center conductor 20, extending between the first and second branches 13 and 15 so as to form a bridge circuit. The current sensor 10 also includes sensing means 11 magnetically coupled to the center conductor 20 for producing an output signal $I_{OUT}$ related in phase and magnitude to the input current $I_{IN}$.

As shown schematically in FIG. 3, the first conducting means or first branch 13 includes first and second conductors 12 and 14, preferably first and second resistors, respectively, having first and second predetermined resistances, respectively. Likewise, the second conducting means or second branch 15 includes third and fourth conductors 16 and 18, preferably third and fourth resistors, respectively, having third and fourth predetermined resistances, respectively. In addition, the interconnecting means or center conductor 20, also preferably a resistor, has a fifth predetermined resistance and extends from a first end 22 between the first and second conductors 12 and 14 of the first conducting means to a second end 24 between the third and fourth conductors 16 and 18 of the second conducting means.

The first branch 13 preferably conducts a first portion $I_1$ of the input current $I_{IN}$ and the second branch 15 conducts a second portion $I_2$ of the input current $I_{IN}$. The bridge circuit is preferably unbalanced such that the first and second portions of the current in the first and second branches 13 and 15, respectively, are unequal and a voltage difference is established across the interconnecting or center conductor 20. Accordingly, a current $I_C$ is established in the interconnecting or center conductor 20. The current in the interconnecting or center conductor 20 is related to the first and second portions of the input current $I_{IN}$ in the first and second branches 13 and 15, respectively, and, thus, is related to the input current $I_{IN}$. In particular, the current in the interconnecting or center conductor 20 is directly proportional to the input current $I_{IN}$ and may be computed as:

$$I_C = \frac{(R_1 R_4 - R_2 R_3) I_{IN}}{(R_1 + R_2)(R_3 + R_4) + R_C(R_1 + R_2 + R_3 + R_4)} \quad (1)$$

Wherein $R_1$, $R_2$, $R_3$, $R_4$, and $R_C$ are the resistances of the first, second, third, fourth and interconnecting conductors, respectively.

Typically, the first and fourth predetermined resistances are selected so as to be much greater than both the second and third predetermined resistances. For example, the first and fourth predetermined resistances are preferably twenty-five to forty times greater than the second and third predetermined resistances. Accordingly, equation (1) may be simplified to:

$$I_C = \frac{(R_1 R_4) I_{IN}}{R_1 R_4 + R_C(R_1 + R_4)} \quad (2)$$

Thus, based upon the desired value of current $I_C$ in the interconnecting or center conductor 20 for a predetermined input current $I_{IN}$, the first and fourth resistances may be determined as well as the resistance of the interconnecting or center conductor Alternatively, for predetermined first, fourth and interconnecting resistances, the ratio of the current $I_C$ in the interconnecting or center conductor 20 to the input current $I_{IN}$ may be determined as:

$$\frac{I_C}{I_{IN}} = \frac{R_1 R_4}{R_1 R_4 + R_C(R_1 + R_4)} \quad (3)$$

Figure 2:
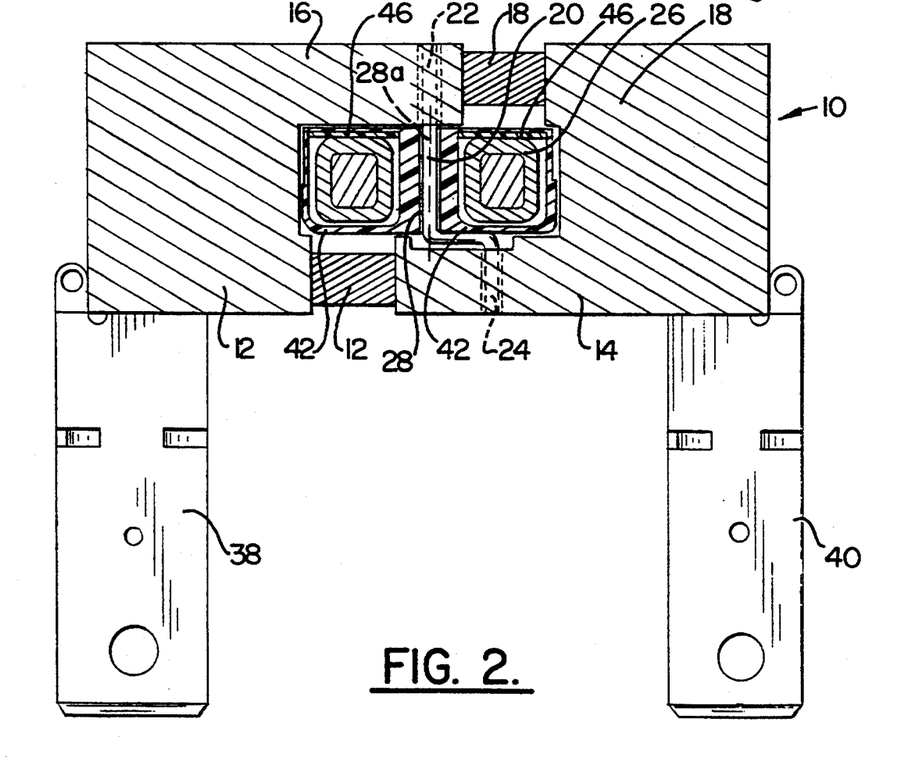
FIG. 2 is an enlarged cross-sectional view of the current sensor of FIG. 1 taken along line 2—2 of FIG. 1.

The sensing means 11 produces an output signal $I_{OUT}$ related to, and preferably proportional to, the current $I_C$ in the interconnecting or center conductor 20. Preferably, the sensing means 11 includes an annular current comparator and, more preferably, includes a toroidal core 26 having a bore 28 extending therethrough as illustrated in FIGS. 2 and 3. The toroidal core 26 is generally comprised of a material such as ferrite. As illustrated in FIG. 2 and as shown schematically in FIG. 3, the interconnecting or center conductor 20 preferably extends through the bore 28 of the toroidal core 26 and is magnetically coupled thereto.

In particular, the current $I_C$ in the interconnecting or center conductor 20 induces a magnetic flux or magnetomotive force in the toroidal core 26. The induced magnetomotive force in the toroidal core 26 is related to, and preferably proportional to, the current $I_C$ in the interconnecting or center conductor 20 and, thus, is related to, and preferably proportional to, the input current $I_{IN}$. By sensing the input current $I_{IN}$ based upon the induced magnetomotive force, the current sensor 10 provides isolation between the output signal $I_{OUT}$ and the input line current $I_{IN}$ to suppress high voltage transients on the input current $I_{IN}$ and to protect the current sensor 10 therefrom.

The sensing means 11 also preferably includes means for magnetically sensing the time-rate of change of the magnetomotive force induced within the toroidal core 26. The means for magnetically sensing the time-rate of change of the magnetomotive force within the toroidal core 26 preferably includes a secondary winding wound about and magnetically coupled to the toroidal core 26 for producing the output signal $I_{OUT}$.

More preferably, the means for magnetically sensing the time-rate of change of the magnetomotive force within the toroidal core 26 includes a feedback secondary winding 30, a sense secondary winding 32 and an amplifier circuit 34 as illustrated in FIG. 3. A voltage is induced in the sense winding 32 due to, and in proportion to, the time-rate of change of the magnetomotive force in the toroidal core 26. The amplifier circuit 34 is responsive to the voltage induced in the sense winding 32 and provides a control or compensation signal to the feedback winding 30. The current in the feedback winding 30 due to the control signal produces a magnetomotive force in the toroidal core 26 which is substantially equal in magnitude and opposite in polarity to the magnetomotive force induced by the current in the interconnecting conductor 20. The resulting net AC magnetomotive force in the toroidal core 26 in a steady-state condition is approximately zero. Any magnetomotive force induced in the toroidal core 26 due to changes in the input current $I_{IN}$ is thus induced in relation to the current $I_C$ in the interconnecting conductor 20 since the maintenance of a minimal, steady-state net magnetomotive force prevents the toroidal core 26 from saturating. The feedback secondary winding 30 also provides the output signal $I_{OUT}$ which is related to, and preferably proportional to, the magnitude and phase of the input current signal $I_{IN}$.

In order to obtain the large transformation ratios required by electronic watthour meters which utilize integrated circuits, two distinct transformations which define two transformation ratios are provided by the current sensor 10 of the present invention. The product of the two transformation ratios is the transformation ratio of the entire current sensor 10 and defines the relationship between the magnitude of the sensed output signal $I_{OUT}$ and that of the input current $I_{IN}$.

In particular, a first transformation ratio is provided by the relationship between the current $I_C$ in the interconnecting or center conductor 20 and the input current $I_{IN}$ as shown in equation (3). In one embodiment, the first bridge circuit preferably defines a transformation ratio of 3:200 such that a current $I_C$ of 3 A is established in the interconnecting or center conductor 20 in response to an input current $I_{IN}$ of 200 A.

The second transformation ratio is provided by the number of secondary windings about the toroidal core 26. More particularly, the ampere-turns for both the primary and secondary side of the current comparator are preferably identical. While the interconnecting or center conductor 20 effectively forms a single turn primary winding about the toroidal core 26, the number of windings of the feedback secondary winding 30 may be varied to optimize the output signal $I_{OUT}$. Thus, the product of the single turn primary and the current in the interconnecting or center conductor 20, i.e., 1 turn×3 A=3 ampere turns, is equal to the product of the number of turns of the feedback secondary winding 30 and the output signal $I_{OUT}$ produced thereby. Therefore, by increasing the number of turns of the feedback secondary winding 30, the resulting output signal $I_{OUT}$ is correspondingly decreased such that the ampere-turns of the primary and secondary sides of the current comparator are equal.

The transformation ratio for the entire current sensor 10, and thus the relationship between the magnitude of the output signal $I_{OUT}$ and input current $I_{IN}$ is a product of the first transformation ratio defined by the ratio of the current $I_C$ in the interconnecting or center conductor 20 to the input current $I_{IN}$, and the second transformation ratio based upon the ampere-turns relationship between the primary and secondary windings of the toroidal core 26 forming the current comparator. In particular, the transformation ratio for the entire current sensor 10 preferably scales the input line current $I_{IN}$ to an output current $I_{OUT}$ of approximately 2 mA such that the output current $I_{OUT}$ may be received by an associated integrated circuit or ASIC.

Thus, for a electronic watthour meter designed to receive a maximum input current of 200 A, the transformation ratio for the entire current sensor 10 must be 100,000:1 to produce an output current $I_{OUT}$ of 2 mA. As explained, the first transformation ratio provided by the bridge circuit produces a 3 A current in the interconnecting or center conductor 20 based upon an input current $I_{IN}$ of 200 A. Thus, the second transformation ratio provided by the ampere-turns relationship between the primary and secondary windings of the toroidal core 26 preferably produces an output current $I_{OUT}$ of 2 mA from the 3 A current in the interconnecting or center conductor 20. The ratio of the secondary windings to the single primary winding formed by the interconnecting conductor 20 must therefore be 1500:1 to provide the second transformation ratio.

As illustrated in FIGS. 1 and 2, the first and fourth conductors, 12 and 18, are preferably comprised of a combination of first and second materials. In contrast, the second and third conductors, 14 and 16, are preferably comprised exclusively of the second material. While various materials may be used without departing from the spirit and scope of the present invention, the first material is preferably a copper nickel alloy, such as Copel, or a magnesium copper alloy, such as Manganin. Preferably, the resistance of the first material does not vary significantly with temperature. For example, the resistivity of manganin varies 0.000015 $\Omega/°$ C.

In contrast, the second material, such as copper or aluminum, preferably has a relatively low resistivity in comparison to the first material. For example, the resistivity of the first material is preferably at least twenty-five times greater than the resistivity of the second material. Thus, the resistivity of the second and third conductors, 14 and 16, is preferably small in comparison to the resistance of the first and fourth conductors, 12 and 18, which include the first material having a relatively large resistance. However, the resistance of the second material does typically vary with temperature.

Even though the resistance of the second material varies with temperature, the performance of the current sensor 10 preferably does not vary with temperature. Thus, the transformation ratio established by the predetermined resistances of the respective conductors must be independent of temperature. Accordingly, the ratio of the first and second predetermined resistances to the third and fourth predetermined resistances preferably remains constant as the temperature of the conductors vary. The relative magnitude and phase of the current $I_C$ in the interconnecting or center conductor 20 to the input current $I_{IN}$ will therefore remain constant as the temperature varies.

Since the second material, such as copper, has a resistance which varies with temperature, each conductor preferably contains predetermined amounts of the second material such that the ratio of the first and second predetermined resistances to the third and fourth predetermined resistances is, as a whole, independent of temperature variations. In particular, the interconnecting or center conductor 20 need not be linear, but may be configured, as shown in FIGS. 1 and 2, such that each conductor contains the predetermined amount of the second material. For example, one end, such as the second end 24 as shown in FIGS. 1 and 2, may be selectably positioned such that the ratio of the resistances of the first and second branches remains constant and independent of temperature.

In addition to the properties of the material comprising the conductors, the resistance of the conductors is established by the cross-sectional areas of the conductors. To adjust or trim the respective resistances of the conductors, a notch or flat 36 may be milled into at least one of the conductors or material may be otherwise removed from one of the conductors to increase its resistance and decrease the current therein as shown in FIG. 1. The resistance of the milled conductor varies directly with the size of the notch or flat 36 or amount of material removed with larger notches creating greater resistance or greater amounts of material being removed creating greater resistance. Thus, further refinement of the predetermined resistances of the conductors and, consequently, the ratio of the resistances between the first and second branches may be obtained by such adjustment or trimming of the conductors.

The interconnecting conductor 20 is also preferably comprised of the first material. Thus, the interconnecting conductor 20 has a relatively large resistance in comparison with the second and third conductors 14 and 16 comprised of the second material. The resistance of the interconnecting conductor 20 is further increased by its relatively small cross sectional area in comparison to the other conductors and its length.

As shown in FIGS. 1 and 2, the input current is preferably provided by a first leg 38, typically comprised of copper or aluminum, to which a first end of both the first and second branches is connected. The second ends of both the first and second branches are preferably connected to a second leg 40 which conducts the output load current $I_0$ to the consumer's electrical load being metered. The first and second legs 38 and 40 are designed to mate with and electrically connect with a standard meter socket or mounting device to allow measurement of the output load current $I_0$ which is being provided to the customer.

As also shown in FIGS. 1 and 2, the first and third conductors 12 and 16 preferably form a first generally U-shaped member having first and second arms, and are connected at their respective first ends to the first leg 38. Likewise, the second and fourth conductors 14 and 18 preferably form a second generally U-shaped member having first and second arms, and are connected at their respective first ends to the second leg 40. In addition, the first and second generally U-shaped members are preferably electron-beam welded to the first and second legs, respectively.

The second ends of the first and second arms of the first generally U-shaped member are connected to the second ends of the first and second arms of the second generally U-shaped member, respectively. In addition, the first and second generally U-shaped members are preferably coplanar as shown in FIGS. 1 and 2. Still further, the center conductor 20 is preferably a wire which extends between the respective second ends of the first arms of both the first and second generally U-shaped members and the respective second ends of the second arms of the first and second generally U-shaped members.

As illustrated in FIG. 2 and shown schematically in FIG. 3, the wire extends through the bore 28 of a toroidal core 26. The bore 28 defines a longitudinal axis 28a which is substantially parallel to and, more preferably, coplanar with the first and second generally U-shaped members. Accordingly, the magnetic coupling between the current in the first and second generally U-shaped members and the secondary windings wound about the toroidal core 26 is reduced and, consequently, phase errors between the output current $I_{OUT}$ and the input line current $I_{IN}$ are reduced.

While the particular configuration of the current sensor 10 may be widely varied, it is preferred that the sensing means 11 be encapsulated by an insulating material 42 to facilitate its operation and longevity. More preferably, this insulating material is a plastic material.

In addition, the wires 44 extending from the encapsulated sensing means 11 in FIG. 1 are connected with an external amplifier circuit (not illustrated). The wires 44 extend from a common printed circuit board 46 on which electrical contact is established between each end of the sense and feedback secondary windings 30 and 32 and one of the wires 44. The external amplifier circuit 30 may be encapsulated with the sensing means 11 to eliminate the wires 44 extending therefrom without departing from the scope of this invention. Alternatively, each end of the sense and feedback windings 30 and 32 as well as a ground wire could be extended from the encapsulated sensing means 11, without connection to a printed circuit board wherein.

As previously explained, the first and second legs, 38 and 40, of the current sensor of the present invention are designed to mate with a conventional meter socket. Accordingly, the potential cost savings provided by the current sensor of the present invention, which is relatively inexpensive to fabricate and which could be incorporated in millions of electronic electricity meters, such as electronic watthour meters, is substantial. In addition, the design of the current sensor of the present invention reduces the mutual inductance or magnetic coupling between the first and second branches, 13 and 15, and the secondary windings, and increases the resistance to reactance ratio of the current sensor in comparison to prior designs. Thus, the phase angle of the output current $I_{OUT}$ more accurately reflects the phase angle of the input current $I_{IN}$.

In the drawings and specification, there have been disclosed typical preferred embodiments of the invention and, although specific terms are employed, the terms are used in a generic and descriptive sense only and not for purposes of limitation, the scope of the invention being set forth in the following claims.

That which is claimed is:

1. An apparatus for sensing an input current, comprising:

first conducting means for conducting a first portion of the input current, said first conducting means comprising first and second conductors having first and second predetermined resistances, respectively;

second conducting means for conducting a second portion of the input current, said second conducting means comprising third and fourth conductors having third and fourth predetermined resistances, respectively;

interconnecting means for conducting current between said first and second conducting means; and sensing means magnetically coupled to said interconnecting means for producing an output signal related to the current conducted by said interconnecting means according to a predetermined transformation ratio, wherein said first and fourth conductors include predetermined amounts of first and second materials, each material having a different resistivity, and wherein said second and third conductors include predetermined amounts of the second material, the predetermined amounts of the first and second materials being selected such that a ratio of the first and second predetermined resistances to the third and fourth predetermined resistances and the resulting transformation ratio produced by the current sensing apparatus remain constant as the temperature of said first, second, third and fourth conductors varies.

2. The current sensing apparatus according to claim 1 wherein said first conducting means comprises first and second conductors having first and second predetermined resistances, respectively, and wherein said second conducting means comprises third and fourth conductors having third and fourth predetermined resistances, respectively.

3. The current sensing apparatus according to claim 1 wherein said interconnecting means is a fifth conductor having a fifth predetermined resistance, and wherein said sensing means includes a toroidal core having a bore extending therethrough.

4. The current sensing apparatus according to claim 3 wherein said fifth conductor extends from a first end between said first and second conductors of said first conducting means to a second end between said third and fourth conductors of said second conducting means, and wherein said fifth conductor extends through said bore of said toroidal core.

5. The current sensing apparatus according to claim 1 wherein said sensing means includes a means for magnetically sensing a time-rate of change of a magnetomotive force induced within said toroidal core by said current conducted by said interconnecting means.

6. The current sensing apparatus according to claim 5 wherein said means for magnetically sensing a time-rate of change of a magnetomotive force induced in said toroidal core includes a secondary winding wound about and magnetically coupled to said toroidal core for producing said output signal.

7. The current sensing apparatus according to claim 5 wherein said means for magnetically sensing a time-rate of change of a magnetomotive force induced in said toroidal core comprises:
 a sense secondary winding wound about and magnetically coupled to said toroidal core;
 amplifier means having an input connected to said sense secondary winding and an output; and
 a feedback secondary winding wound about and magnetically coupled to said toroidal core and connected at a first end to said output of said amplifier means.

8. The current sensing apparatus according to claim 1 wherein the resistance of said first material varies significantly less with temperature than the resistance of said second material.

9. The current sensing apparatus according to claim 8 wherein said first material is a copper nickel alloy and said second material is copper.

10. The current sensing apparatus according to claim 1 wherein said first conductor includes a notch whereby the resistance of said first conductor varies in relation to the size of said notch.

11. The current sensing apparatus according to claim 1 wherein said output signal is directly proportional to both the current conducted by said interconnecting means and the input current.

12. The current sensing apparatus according to claim 1 wherein the sum of the magnitude of said first and second input current portions substantially equals the magnitude of said input current.

13. A current sensing apparatus comprising:
 first and second resistors having first and second predetermined resistances, respectively, for conducting a first portion of an input current;
 third and fourth resistors having third and fourth predetermined resistances, respectively, for conducting a second portion of an input current;
 an interconnecting resistor having a fifth predetermined resistance for conducting current between a first end between said first and second resistors to a second end between said third and fourth resistors; and
 an annular current comparator responsive to the current conducted by said interconnecting resistor for producing an output signal related to said input current according to a predetermined transformation ratio,
 wherein said first and fourth resistors include predetermined amounts of first and second materials, each material having a different respective resistivity, and wherein said second and third resistors include predetermined amounts of the second material, the predetermined amounts of the first and second materials being selected such that a ratio of the first and second predetermined resistances to the third and fourth predetermined resistances and the resulting transformation ratio provided by the current sensing apparatus remain constant as the temperature of said first, second, third and fourth resistors varies.

14. The current sensing apparatus according to claim 13 wherein said annular current comparator includes a toroidal core defining a bore extending therethrough, and wherein said interconnecting resistor extends through said bore.

15. The current sensing apparatus according to claim 14 further comprising means for magnetically sensing a time-rate of change of a magnetomotive force induced within said toroidal core by the current conducted by said interconnecting resistor.

16. The current sensing apparatus according to claim 15 wherein said means for magnetically sensing a time-rate of change of a magnetomotive force induced in said toroidal core includes a secondary winding wound about and magnetically coupled to said toroidal core for producing the output signal.

17. The current sensing apparatus according to claim 15 wherein said means for magnetically sensing a time-rate of change of a magnetomotive force induced in said toroidal core comprises:
 a sense secondary winding wound about and magnetically coupled to said toroidal core;
 amplifier means having an input connected to said sense secondary winding and an output; and
 a feedback secondary winding wound about and magnetically coupled to said toroidal core and connected at a first end to said output of said amplifier means.

18. The current sensing apparatus according to claim 13 wherein the resistance of the first material varies significantly less with temperature than the resistance of the second material.

19. A current sensing apparatus comprising:
 a first leg for conducting an input current;

bridge circuit means for receiving and dividing the input current into predetermined portions, said bridge circuit means comprising:

first and second branches, connected at their respective first ends to said first leg, for conducting first and second portions of the input current, respectively, wherein said first branch comprises first and second conductors having first and second predetermined resistances, respectively, and wherein said second branch comprises third and fourth conductors having third and fourth predetermined resistances, respectively; and a center conductor interconnecting said first and second branches between their respective first and second ends and conducting a current related to the input current;

a second leg for conducting an output current, said second leg connected to a second end of both said first and second branches; and a toroidal core having a bore through which said center conductor extends, wherein said first and fourth conductors include predetermined amounts of first and second materials, each material having a different resistivity, and wherein said second and third conductors include predetermined amounts of the second material, the predetermined amounts of the first and second materials being selected such that a ratio of the first and second predetermined resistances to the third and fourth predetermined resistances remains constant as the temperature of said first, second, third and fourth conductors varies.

20. The current sensing apparatus according to claim 19 wherein said center conductor has a fifth predetermined resistance and extends from a first end between said first and second conductors of said first branch to a second end between said third and fourth conductors of said second branch.

21. The current sensing apparatus according to claim 19 wherein the resistance of said first material varies significantly less with temperature than the resistance of said second material.

22. The current sensing apparatus according to claim 19 further comprising means for magnetically sensing a time-rate of change of a magnetomotive force induced within said toroidal core for producing an output signal related to said input current.

* * * * *